(12) United States Patent
Kadoya et al.

(10) Patent No.: US 11,774,989 B2
(45) Date of Patent: Oct. 3, 2023

(54) PULSE SHOT-TYPE FLOW RATE CONTROL DEVICE, PULSE SHOT-TYPE FLOW RATE CONTROL METHOD, AND PROGRAM

(71) Applicant: CKD CORPORATION, Komaki (JP)

(72) Inventors: Hiroki Kadoya, Komaki (JP); Yasunori Nishimura, Komaki (JP)

(73) Assignee: CKD CORPORATION, Komaki (JP)

( * ) Notice: Subject to any disclaimer, the term of this patent is extended or adjusted under 35 U.S.C. 154(b) by 0 days.

(21) Appl. No.: 17/799,964

(22) PCT Filed: Mar. 2, 2021

(86) PCT No.: PCT/JP2021/007910
§ 371 (c)(1),
(2) Date: Aug. 16, 2022

(87) PCT Pub. No.: WO2021/199849
PCT Pub. Date: Oct. 7, 2021

(65) Prior Publication Data
US 2023/0063288 A1 Mar. 2, 2023

(30) Foreign Application Priority Data
Mar. 30, 2020 (JP) .................................. 2020-061099

(51) Int. Cl.
*G05D 7/06* (2006.01)
*H01L 21/67* (2006.01)

(52) U.S. Cl.
CPC ......... *G05D 7/0623* (2013.01); *G05D 7/0647* (2013.01); *H01L 21/67017* (2013.01)

(58) Field of Classification Search
CPC .. G05D 7/0623; G05D 7/0647; G05D 7/0635; H01L 21/67017; H01L 21/67253
See application file for complete search history.

(56) References Cited

U.S. PATENT DOCUMENTS 7,628,860 B2 * 12/2009 Shajii .................. G05D 7/0647
118/690
8,997,686 B2 * 4/2015 Ding ....................... C23C 16/52
137/142
(Continued)

FOREIGN PATENT DOCUMENTS

| JP | 4197648 B2 | 12/2008 |
| TW | 485724 | 5/2002 |
| TW | 552490 B | 9/2003 |

OTHER PUBLICATIONS

May 25, 2021 International Search Report issued in International Patent Application No. PCT/JP2021/007910.
(Continued)

*Primary Examiner* — Ramon A. Mercado
*Assistant Examiner* — Olvin Lopez Alvarez
(74) *Attorney, Agent, or Firm* — Oliff PLC

(57) ABSTRACT

A pulse shot-type flow rate control device including first and second shutoff valves, a tank, a pressure sensor, and a controller is caused to perform two or more processes. In each process, the controller repeats pulse shots of alternately causing the first shutoff valve and the second shutoff valve to open and close, changes a way of the pulse shots based on a pressure difference between the pressure after filling and the pressure after discharge, and controls a volume flow rate. In each process, the controller stores, as an optimal filling time, a filling time when the volume flow rate is controlled to a target flow rate, and opens and closes the first shutoff valve by using the optimal filling time in a first pulse shot in the next process.

8 Claims, 10 Drawing Sheets

(56) References Cited

U.S. PATENT DOCUMENTS

2004/0244837 A1    12/2004  Nawata et al.
2017/0167026 A1*    6/2017  Nakada ..................... G01F 3/36
2020/0081459 A1*    3/2020  L'Bassi ................ G05D 7/0635
2020/0321225 A1*   10/2020  Ding ................. H01L 21/67248

OTHER PUBLICATIONS

Sep. 29, 2022 International Preliminary Report on Patentbility issued in International Patent Application No. PCT/JP2021/007910.

* cited by examiner

S30: GAS REPLACEMENT PROCESSING
S40: LEARNING PROCESSING
S50: FLOW RATE CONTROL PROCESSING

AA: TARGET FLOW RATE Q
BB: CONTROL DEVIATION
CC: VOLUME FLOW RATE CALCULATION CIRCUIT
DD: MEASURED PRESSURE VALUE

PULSE SHOT-TYPE FLOW RATE CONTROL DEVICE, PULSE SHOT-TYPE FLOW RATE CONTROL METHOD, AND PROGRAM

CROSS-REFERENCE TO RELATED APPLICATIONS

This is a US national phase application based on the PCT International Patent Application No. PCT/JP2021/007910 filed on Mar. 2, 2021, and claiming the priority to Japanese Patent Application No. 2020-061099 filed on Mar. 30, 2020, the entire contents of which are incorporated by reference herein.

TECHNICAL FIELD

The present invention relates to a pulse shot-type flow rate control device, a pulse shot-type flow rate control method, and a program, to regulate a volume flow rate of gas.

BACKGROUND ART

Conventionally, gas supply systems for semiconductor manufacturing apparatuses and others would use for example thermal mass flow controllers to accurately control the flow rate of gas. In recent years, high-temperature gases of 100° C. or higher may be targets for control, but the thermal mass flow controllers could not control such high-temperature gases.

For example, Patent Document 1 discloses a pulse shot-type flow rate control device that can control the flow rate of hot gas. This pulse shot-type flow rate control device is provided with a first shutoff valve connected to a gas source, a second shutoff valve connected to the first shutoff valve, a gas filling capacity provided between the first shutoff valve and the second shutoff valve, a pressure sensor for measuring the pressure in the gas filling capacity, and a controller.

The controller of the pulse shot-type flow rate control device repeats a pulse shot of causing the first shutoff valve to open and close and then causing the second shutoff valve to open and close, as shown in FIG. 9. In addition, the controller changes a filling time of filling gas by opening of the first shutoff valve in a next pulse shot based on a pressure difference D1 between the pressure (an after-filling pressure) P1 in the gas filling capacity after gas is filled by opening and closing of the first shutoff valve and the pressure (an after-discharge pressure) P2 in the gas filling capacity after the gas is discharged by opening and closing of the second shutoff valve, which pressures are obtained using the pressure sensor, thus changing the manner of the pulse shot to adjust the flow rate of gas to a target flow rate.

RELATED ART DOCUMENTS

Patent Documents

Patent Document 1: Japanese patent No. 4197648

SUMMARY OF INVENTION

Problems to be Solved by the Invention

However, the conventional art has some problems. In the conventional pulse shot-type flow rate control device, specifically, when the pulse shot is repeated to repeat the process for supplying gas, for example, gas usage conditions may vary from process to process. Meanwhile, the conventional pulse shot-type flow rate control device is configured to perform a first pulse shot in each process in the same manner and, as shown in FIG. 10, gradually change the manner of the pulse shot according to the pressure difference D1 in the pulse shot. Thus, the conventional pulse shot-type flow rate control device might require a long response time from the start of each process until the flow rate of gas is adjusted to the target flow rate.

The present invention has been made to address the above problems and has a purpose to provide a technique that can improve the response of a pulse shot-type flow rate control device configured to repeat a pulse shot to control a flow rate of gas to a target flow rate.

Means of Solving the Problems

One aspect of the present invention is configured as below. (1) A a pulse shot-type flow rate control device comprises: a first shutoff valve connected to a gas source; a second shutoff valve connected to the first shutoff valve; a gas filling capacity between the first shutoff valve and the second shutoff valve; and a pressure sensor for measuring a pressure in the gas filling capacity, wherein two or more processes for controlling gas to a target flow rate are performed, the first shutoff valve, the second shutoff valve, and the pressure sensor are connected communicatively to a controller that controls operations of the pulse shot-type flow rate control device, in each of the processes, the controller executes a flow rate control processing of: repeating a pulse shot of causing the first shutoff valve to open and close and, after that, causing the second shutoff valve to open and close; calculating a volume flow rate of gas exhausted from the gas filling capacity based on a pressure after filling measured by use of the pressure sensor after the first shutoff valve is opened and closed to fill gas into the gas filling capacity and a pressure after discharge measured by use of the pressure sensor after the second shutoff valve is opened and closed to discharge gas from the gas filling capacity; and changing a manner of repeating the pulse shot to regulate the volume flow rate to the target flow rate, and the controller further executes: an optimal filling time storage processing of storing, as an optimal filling time, a filling time of filling the gas into the gas filling capacity by opening and closing of the first shutoff valve when the pulse shot that regulates the volume flow rate to the target flow rate is performed in the flow rate control processing; and a filling time control processing of opening and closing the first shutoff valve with the optimal filling time stored in the optimal filling time storage processing in a first pulse shot in the flow rate control processing in a next process to be performed after the process in which the optimal filling time storage processing is executed.

In the pulse shot-type flow rate control device configured as above, in the first pulse shot in executing a process, the first shutoff valve is opened and closed for the optimal filling time stored in a previous process. In the first pulse shot, accordingly, the gas filling capacity is supplied with the gas suitable for regulating the volume flow rate of gas to be exhausted through the second shutoff valve to a target flow rate, so that the volume flow rate of the gas discharged through the second shutoff valve is likely to be adjusted to the target flow rate or a value close to the target flow rate. Consequently, the pulse shot-type flow rate control device configured as above can shorten the response time from the start of each process until the gas stabilizes at the target flow rate, and achieve improved response.

(2) In the pulse shot-type flow rate control device described in (1), preferably, in the optimal filling time storage processing, the filling time in a last pulse shot is stored as the optimal filling time.

In the pulse shot-type flow rate control device configured as above, the filling time measured in the last pulse shot, by which the volume flow rate is likely to have been adjusted to the target flow rate, is stored as the optimal filling time. Thus, processing loads and memory loads in storing the optimal filling time can be reduced.

(3) In the pulse shot-type flow rate control device described in (1) or (2), preferably, the controller causes the first shutoff valve and the second shutoff valve to simultaneously open to execute gas replacement processing to replace gas remaining in the gas filling capacity.

In the pulse shot-type flow rate control device configured as above, the first shutoff valve and the second shutoff valve are opened at the same time to perform gas replacement. This configuration allows the gas supplied from a gas source to flow through the gas filling capacity, thereby making it easy to replace the gas remaining in the gas filling capacity with the supplied gas. It is therefore possible to more quickly replace gas than in the case where gas replacement is performed by alternately causing the first shutoff valve and the second shutoff valve to open and close.

(4) In the pulse shot-type flow rate control device described in (3), preferably, after the replacement processing, the controller executes a pressure regulation processing causing the first shutoff valve and the second shutoff valve that are open to close in order to regulate the pressure in the gas filling capacity to a target pressure in the gas filling capacity for execution of the flow rate control processing.

In the pulse shot-type flow rate control device configured as above, after the first shutoff valve and the second shutoff valve are opened at the same time to replace gas in the gas filling capacity, the first shutoff valve and the second shutoff valve are closed at the timing to regulate the pressure in the gas filling capacity to the target pressure in the gas filling capacity for executing the flow rate control processing. Accordingly, in the process after gas replacement, the pressure in the gas filling capacity is already controlled to the target pressure before the first pulse shot, so that a delay in the response time due to variation in the pressure in the gas filling capacity can be suppressed.

(5) In the pulse shot-type flow rate control device described in any one of (1) to (4), preferably, the controller executes: a learning processing of: repeating the pulse shot by changing the filling time to fill the gas into the gas filling capacity by opening and closing of the first shutoff valve, while keeping a discharge time constant to discharge the gas from the gas filling capacity by opening and closing of the second shutoff valve; calculating a volume flow rate of gas exhausted through the second shutoff valve for each filling time; and learning a relationship between the filling time and the volume flow rate; and in the flow rate control processing, when the target flow rate is changed from a target flow rate used in an immediately preceding process or, alternatively, when the target flow rate is changed during execution of the flow rate control processing, a correction processing of correcting the optimal filling time according to a difference between the target flow rate and a changed target flow rate based on the relationship between the filling time and the volume flow rate, that has been learnt in the learning processing.

In the pulse shot-type flow rate control device configured as above, when the target flow rate is changed from the target flow rate used in an immediately preceding process or changed during the flow rate control processing, the optimal filling time is corrected according to a difference between the target flow rate and the changed target flow rate, based on the previously learnt relationship between the filling time and the volume flow rate, so that the gas flow rate can be rapidly regulated to the changed target flow rate.

(6) In the pulse shot-type flow rate control device described in (3) or (4), preferably, the controller executes: a learning processing of: repeating the pulse shot by changing the filling time to fill the gas into the gas filling capacity by opening and closing of the first shutoff valve, while keeping a discharge time constant to discharge the gas from the gas filling capacity by opening and closing of the second shutoff valve; calculating a volume flow rate of gas exhausted through the second shutoff valve for each filling time; and learning a relationship between the filling time and the volume flow rate; and in the flow rate control processing, when the target flow rate is changed from a target flow rate used in an immediately preceding process or, alternatively, when the target flow rate is changed during execution of the flow rate control processing, a correction processing of correcting the optimal filling time according to a difference between the target flow rate and a changed target flow rate based on the relationship between the filling time and the volume flow rate, that has been learnt in the learning processing, and the controller further executes: a mode setting processing of setting a flow rate control mode of executing the flow rate control processing, a gas replacement mode of executing the replacement processing, or a learning mode of executing the learning processing, and the processing corresponding to the mode set in the mode setting processing.

In the pulse shot-type flow rate control device configured as above, the flow rate control processing, the replacement processing, or the learning processing is executed according to the set mode among the flow rate control mode, the gas replacement mode, and the learning mode. This device is thus easy to use since each processing can be executed at any given timing.

(7) Another aspect of the present invention provides a pulse host-type flow rate control method, using a pulse shot-type flow rate control device comprising: a first shutoff valve connected to a gas source; a second shutoff valve connected to the first shutoff valve; a gas filling capacity between the first shutoff valve and the second shutoff valve; and a pressure sensor for measuring a pressure in the gas filling capacity, wherein operations of the pulse shot-type flow rate control device are controlled by a controller communicatively connected to the first shutoff valve, the second shutoff valve, and the pressure sensor, the method causes the pulse shot-type flow rate control device to perform: two or more processes for controlling gas to a target flow rate; and in each of the processes, a flow rate control step of: repeating a pulse shot of causing the first shutoff valve to open and close and, after that, causing the second shutoff valve to open and close; calculating a volume flow rate of gas exhausted from the gas filling capacity based on a pressure after filling measured by use of the pressure sensor after the first shutoff valve is opened and closed to fill gas into the gas filling capacity and a pressure after discharge measured by use of the pressure sensor after the second shutoff valve is opened and closed to discharge gas from the gas filling capacity; and changing a manner of repeating the pulse shot to regulate the volume flow rate to the target flow rate, and the method further causes the pulse shot-type flow rate control device to perform: an optimal filling time storage step of storing, as an optimal filling time, a filling time of filling the gas into the gas filling capacity by opening and closing of the first shutoff valve when the pulse shot that regulates the volume flow rate to the target flow rate is performed in the flow rate control step; and a filling time control step of opening and closing the first shutoff valve with the optimal filling time stored in the optimal filling time storage step in a first pulse shot in the flow rate control step in a next process to be performed after the process in which the optimal filling time storage step is performed.

(8) Still another aspect of the present invention provides a program installed in a controller for controlling operations of a pulse shot-type flow rate control device comprising: a first shutoff valve connected to a gas source; a second shutoff valve connected to the first shutoff valve; a gas filling capacity between the first shutoff valve and the second shutoff valve; and a pressure sensor for measuring a pressure in the gas filling capacity, wherein when the flow rate control device performs two or more processes for controlling gas to a target flow rate, the program causes the controller, in each of the processes, to execute a flow rate control processing of: repeating a pulse shot of causing the first shutoff valve to open and close and, after that, causing the second shutoff valve to open and close; calculating a volume flow rate of gas exhausted from the gas filling capacity based on a pressure after filling measured by use of the pressure sensor after the first shutoff valve is opened and closed to fill gas into the gas filling capacity and a pressure after discharge measured by use of the pressure sensor after the second shutoff valve is opened and closed to discharge gas from the gas filling capacity; and changing a manner of repeating the pulse shot to regulate the volume flow rate to the target flow rate, and the program further causes the controller to execute: an optimal filling time storage processing of storing, as an optimal filling time, a filling time of filling the gas into the gas filling capacity by opening and closing of the first shutoff valve when the pulse shot is performed to regulate the volume flow rate to the target flow rate in the flow rate control processing; and a filling time control processing of opening and closing the first shutoff valve with the optimal filling time stored in the optimal filling time storage processing in a first pulse shot in the flow rate control processing in a next process to be performed after the process in which the optimal filling time storage processing is executed.

Effects of the Invention

According to the present invention, therefore, a pulse shot-type flow rate control device for controlling a gas flow rate to a target flow rate by repeating pulse shots can achieve improved response.

MODE FOR CARRYING OUT THE INVENTION

A detailed description of an embodiment of a pulse shot-type flow rate control device, a pulse shot-type flow rate control method, and a program according to the present invention will now be given referring to the accompanying drawings.

<Schematic Configuration of Pulse Shot-Type Flow Rate Control Device>

Figure 1:
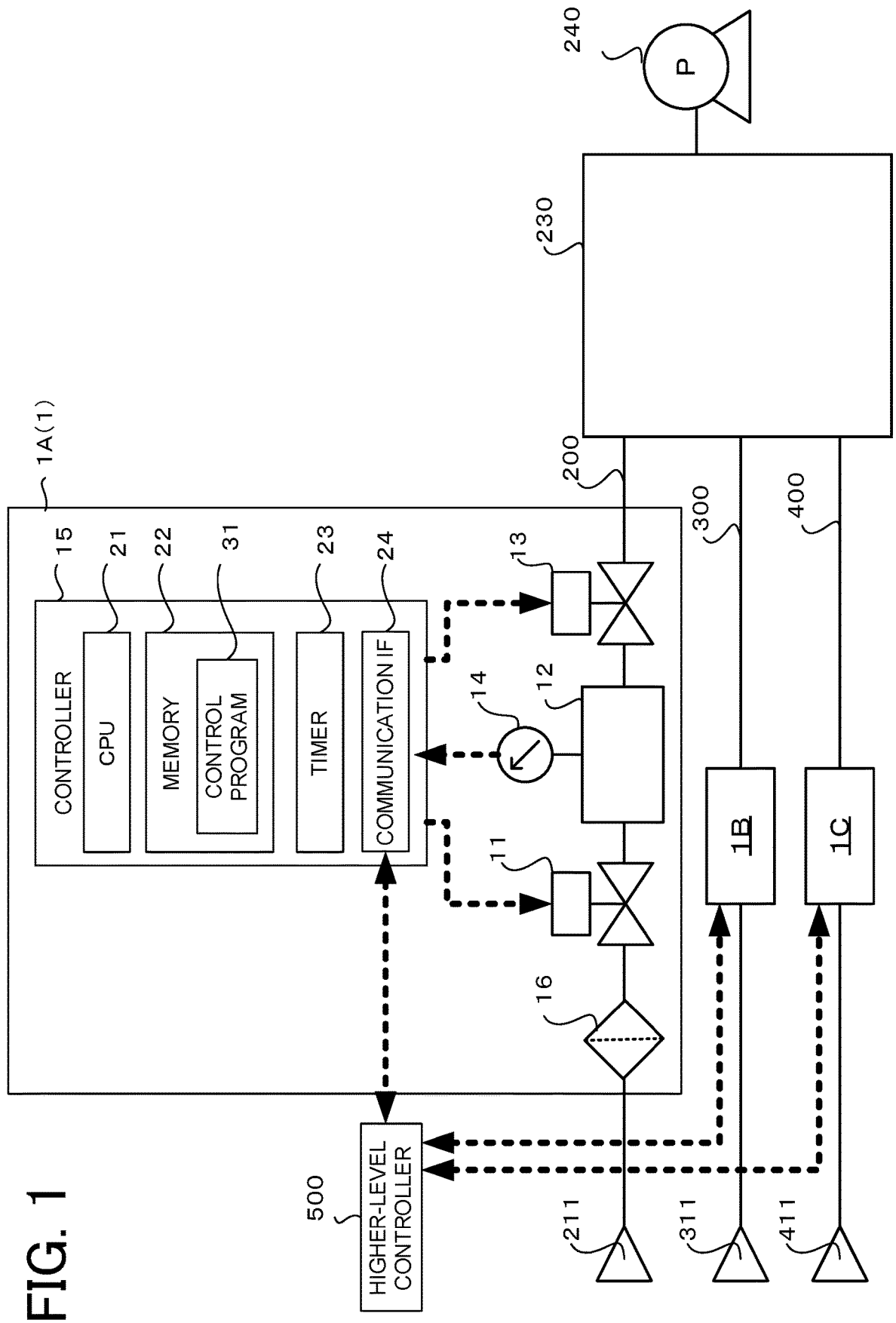
FIG. 1 is a schematic configuration diagram of a pulse shot-type flow rate control device in an embodiment of the present invention.

In the present embodiment, as shown in FIG. 1, the present invention is applied to a pulse shot-type flow rate control device for controlling the flow rate of gas to be supplied to a chamber 230, which will be hereinafter abbreviated to a "flow rate control device".

In the chamber 230, which is controlled to a vacuum atmosphere by evacuation using a vacuum pump 240 for example, a predetermined film is formed on a wafer by an atomic layer deposition (Atomic Layer Deposition, hereafter abbreviated to "ALD"). In the ALD, a cycle of (a) supplying of raw material gas, (b) purging with inert gas, (c) supplying of reactive gas, and (d) purging with inert gas is repeated to adjust the film thickness of a film to be formed on a wafer in 0.1 μm increments.

In the ALD, if different kinds of gasses are mixed, they may solidify. Thus, a pipe 200 connected to a gas source 211 of raw material gas, a pipe 300 connected to a gas source 311 of reactive gas, and a pipe 400 connected to a gas source 411 of inert gas are separately connected to the chamber 230.

The raw material gas is for example TMA (trimethylaluminum). The reactive gas is for example $H_2O$ (water vapor). The inert gas is for example $N_2$ gas. TMA is a solid substance at room temperature and, when supplied to the chamber 230, it vaporizes to form a high-temperature gas of 120° C. or higher.

For film formation using the ALD, the amounts of various gases to be supplied are controlled by the time for supplying each gas. In the ALD, further, the above-described cycle of (a) to (d) is repeated several hundred times per wafer. In this case, for example, each of the time for supplying TMA in (a) and the time for supplying $H_2O$ in (c) respectively to the chamber 230 is several tens of milliseconds, and the time for supplying (purging) $N_2$ to the chamber 230 in each of (b) and (d) is several seconds to several tens of seconds. Thus, the gases to be supplied to the chamber 230 have to be controlled with high precision, high frequency, and high speed. For this purpose, the pipes 200, 300, and 400 are respectively equipped with flow rate control devices 1A, 1B, and 1C each configured to alternately cause a first shutoff valve 11 and a second shutoff valve 13 to open and close to control a flow rate.

The configuration of the flow rate control device 1 will be described concretely referring to FIG. 1. The flow rate control devices 1A to 1C have identical configurations and thus the following description is given to only the flow rate control device 1A provided on the pipe 200. These flow rate control devices are also collectively referred to as a "flow rate control device 1" unless they particularly need to be distinguished.

The flow rate control device 1 is provided with the first shutoff valve 11, a tank 12, the second shutoff valve 13, and a pressure sensor 14. The first shutoff valve 11 is placed upstream of the tank 12 and connected to the gas source 211 which is pressurized. The second shutoff valve 13 is placed downstream of the tank 12 and connected to the chamber 230 which is under vacuum atmosphere. The tank 12 is a hermetically closed space formed when the first shutoff valve 11 and the second shutoff valve 13 are closed. The tank 12 in the present embodiment has a volume of 5 to 1000 cc, for example. The tank 12 is one example of a "gas filling capacity". As an alternative, the gas filling capacity may be constituted of a pipe or pipes instead of the tank 12. The pressure sensor 14 is a vacuum pressure gauge for high temperatures. A filter 16 is located upstream of the first shutoff valve 11 and removes foreign substances from the gas flowing into the flow rate control device 1.

The first shutoff valve 11 and the second shutoff valve 13 are air-operated opening-closing valves. The first shutoff valve 11 and the second shutoff valve 13 can control even high-temperature gasses of 120° C. or higher. Further, for the first shutoff valve 11 and the second shutoff valve 13, for example, high-speed valves capable of opening and closing in several-msec cycles are adopted. In general, a valve used in a pipe generally has a bore diameter of ¼ inch of the pipe diameter. In contrast, each of the first shutoff valve 11 and the second shutoff valve 13 is a valve with a bore diameter of, for example, ⅜ inch of the pipe diameter, increasing a Cv value. The Cv values of the first shutoff valve 11 and the second shutoff valve 13 are 0.6, for example. Thus, since the first shutoff valve 11 and the second shutoff valve 13, each of which has such a high Cv value and can operate at high speed and high frequency, are respectively placed upstream and downstream of the tank 12, the flow rate control device 1 can suppress pulsations caused by the opening and closing actions of the first shutoff valve 11 and the second shutoff valve 13. In addition, the flow rate control device 1 allows gas to flow more easily than a thermal mass flow controller having a restricted section and hence can quickly supply the gas to the chamber 230.

During a process, the flow rate control device 1 repeats a pulse shot, at high speed, of causing the first shutoff valve 11 to open and close and, after that, causing the second shutoff valve 13 to open and close in order to control the flow rate of gas to a target flow rate. In the present description, the target flow rate is defined as a volume flow rate of gas to be exhausted through the second shutoff valve 13 per unit time. Therefore, the flow rate control device 1 is located near the chamber 230. For example, the second shutoff valve 13 and the chamber 230 are connected directly to each other or coupled through a pipe having a length of 2 m or less. The first shutoff valve 11 and the second shutoff valve 13 are not limited to the air-operated opening-closing valves and may be for example electromagnetic opening-closing valves.

The flow rate control device 1 in the present embodiment is controlled by a controller 15 to operate. The controller 15 is communicatively coupled to the first shutoff valve 11, the second shutoff valve 13, and the pressure sensor 14. The controller 15 is one example of a "controller".

The controller 15 is a well-known microcomputer provided with a CPU 21 and a memory 22. The memory 22 includes a nonvolatile memory and a volatile memory. The memory 22 stores various programs and data. The CPU 21 executes various processings by running the programs stored in the memory 22 while temporarily storing data in the memory 22.

For example, the memory 22 stores a control program 31 for controlling the operations of the flow rate control device 1. The control program 31 performs for example a gas replacement processing to replace the gas remaining in the tank 12 with the gas supplied from the gas source 211. The control program 31 also performs a flow rate control processing to control a flow rate of gas. Further, the control program 31 also performs a learning processing to learn a relationship between the filling time of supplying gas into the tank 12 and the volume flow rate of gas exhausted from the tank 12 through the second shutoff valve 13. These gas replacement processing, flow rate control processing, and learning processing will be described later. The control program 31 is an example of a "program".

The non-volatile memory of the memory 22 stores data to be used for the control program 31. For example, the memory 22 stores an optimal filling time to be used in a first pulse shot in the flow rate control processing. For the optimal filling time, for example, an initial value is stored when the control program 31 is installed and, thereafter, this value is updated as needed as the flow rate control processing is repeated. Further, the memory 22 also stores for example a target flow rate used for the flow rate control processing in a past process. The memory 22 also stores for example a correction graph indicating the relationship between the filling time and the volume flow rate, which have been learned in the learning processing.

The controller 15 is further provided with a timer 23 for measuring time and a communication interface 24 (hereinafter, abbreviated to a "communication IF 24") for communication with external devices. The controller 15 is communicatively coupled, through the communication IF 24, to a higher-level controller 500 for controlling operations of a semiconductor manufacturing device. The controller 15 may be connected to the higher-level controller 500 by wire or wireless communication.

The flow rate control device 1 configured as above may be unitized in which the filter 16, the first shutoff valve 11, the second shutoff valve 13, the pressure sensor 14, and the controller 15 are connected to each other and installed together in a housing not shown. In this case, the flow rate control device 1 is easy to handle and needs no wiring work excepting connecting the communication IF 24 to the higher-level controller 500.

However, the controller 15 may be located outside the housing not shown, for example, incorporated in an external controller, such as the higher-level controller 500. Further, the control program 31 may be installed in the higher-level controller 500 so that the higher-level controller 500 functions as the controller 15, and the higher-level controller 500 serves as a controller for controlling the operations of the flow rate control device.

<Description of Operations of the Pulse Shot Shot-Type Flow Rate Control Device: Control Processing>

Figure 2:
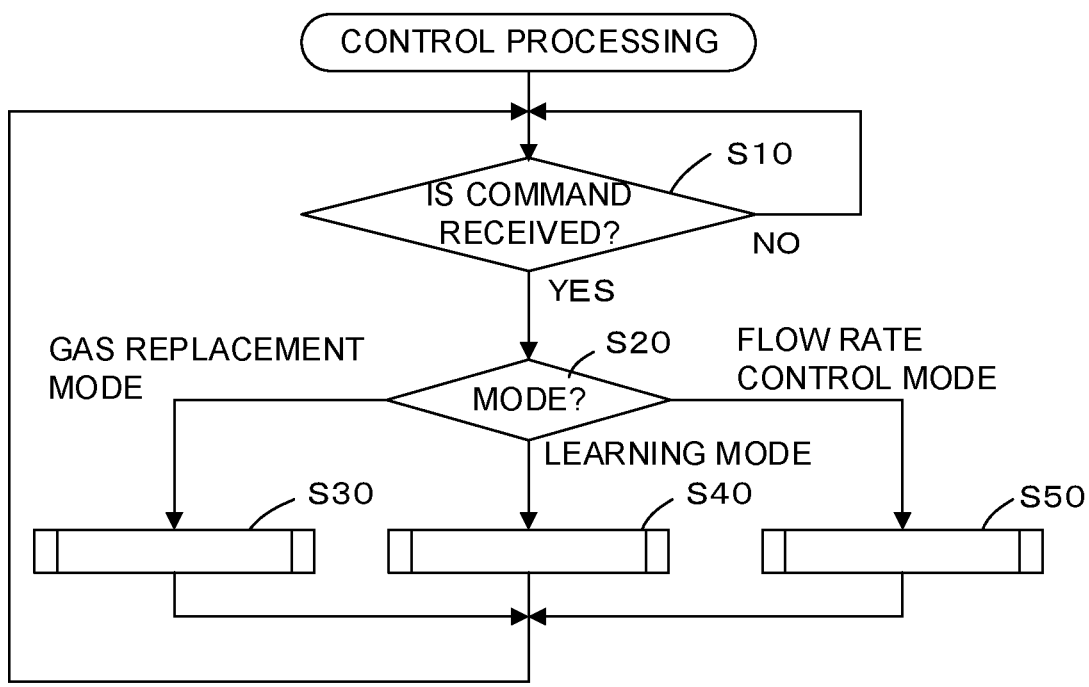
FIG. 2 is a flowchart describing the steps of a control processing.

The operations of the flow rate control device 1 will be described below. FIG. 2 is a flowchart showing the steps of the control processing. Upon power-on of the flow rate control device 1, the CPU 21 starts the control program 31 to execute the control processing shown in FIG. 2. In the present embodiment, the flow rate control device 1 receives a mode according to a command from the higher-level controller 500 and executes the processing corresponding to the mode. In the case where the flow rate control device 1 includes an operating unit for input of information, the flow rate control device 1 may receive a mode through the operating unit.

The CPU 21 first determines whether or not the command is received (S10). For example, upon starting, the control program 31 transmits a control enabling notification, which indicates that the control of the flow rate control device 1 is enabled, to the higher-level controller 500. This control enabling notification is accompanied by identification information that identifies the flow rate control device 1. Upon receipt of the control enabling notification, the higher-level controller 500 appropriately transmits a command required for control of gas flow rate to the flow rate control device 1 corresponding to the identification number attached to the control enabling notification. When not receiving the command from the higher-level controller 500 through the communication IF 24, the CPU 21 determines that no command is received (S10: NO), and waits.

In contrast, when receiving the command transmitted from the higher-level controller 500 through the communication IF 24, the CPU 21 determines that the command is received (S10: YES). In this case, the CPU 21 analyzes the received command and determines a mode (S20). The processing in S20 is one example of a "mode setting processing". The mode in the present embodiment includes a gas replacement mode, a flow rate control mode, and a learning mode. The mode does not need to include all the above modes and may be only for example the flow rate control mode. As an alternative, a different mode or modes from those modes may be included.

The gas replacement mode is a mode of executing the gas replacement processing. For example, in the flow rate control device 1 which is powered on, air may have been mixed in the tank 12. The gas mixed with the air has a different molecular weight of gas components from that in normal and thus may degrade the quality of films formed with such gases. Therefore, the higher-level controller 500 transmits a gas replacement command that instructs the execution of the gas replacement processing to the flow rate control device 1 to which the control enabling notification was sent.

Upon receiving the gas replacement command transmitted from the higher-level controller 500 through the communication IF 24, the CPU 21 determines that the gas replacement mode is set (S20: Gas replacement mode) and executes the gas replacement processing (S30). When the gas replacement processing is terminated, the CPU 21 returns to the processing in S10. The gas replacement processing will be described later.

The flow rate control mode is a mode of executing the flow rate control processing. For example, when a process for supplying TMA to the chamber 230 is to be executed for a predetermined time (e.g., several tens of msec), the higher-level controller 500 transmits a flow rate control start command that instructs the start of the flow rate control to the flow rate control device 1. After one layer of film is formed on a wafer, the higher-level controller 500 transmits a flow rate control termination command to the flow rate control device 1 to instruct the termination of the flow rate control, and stops the process.

When the CPU 21 receives, through the communication IF 24, the flow rate control start command transmitted from the higher-level controller 500, the CPU 21 determines that the flow rate control mode is set (S20: Flow rate control mode) and executes the flow rate control processing (S50). When the flow rate control processing is terminated, the CPU 21 returns to the processing in S10. The flow rate control processing will be described later.

The learning mode is a mode of executing the learning processing. For example, TMA used in the ALD is a gas generated by vaporization of solid material, and an amount of vaporization decreases as the solid material is consumed. In other words, gas usage conditions may change depending on the remaining amount of the solid material. Thus, the higher-lever controller 500 may change the target flow rate depending on the gas usage conditions. In such cases, it is desirable to change the manner of pulse shots with high responsivity to follow the changed target flow rate.

Therefore, the higher-level controller 500 transmits a learning command that instructs the execution of the learning processing to the flow rate control device 1 to which the control enabling notification was transmitted. When the CPU 21 receives the learning command transmitted from the higher-level controller 500 through the communication IF 24, the CPU 21 determines that the mode is set (S20: Learning mode) and executes the learning processing (S40). When the learning processing is terminated, the CPU 21 returns to the processing in S10. The learning processing will be described later.

For example, the higher-level controller 500 may transmit a learning command only once after receiving the control enabling notification or may transmit a learning command each time before a process for controlling the gas flow rate. Further, the higher-level controller 500 may transmit a learning command each time after the process is performed a predetermined number of times (e.g., 20 times).

When the flow rate control device 1 is powered off, the CPU 21 terminates the control program 31. Before termination, the control program 31 transmits a control disabling notification, which indicates that the control of the flow rate control device 1 is disabled, to the higher-level controller 500. This control disabling notification is accompanied by the identification information of the flow rate control device 1. Upon receipt of the control disabling notification, the higher-level controller 500 will no longer send a command to the flow rate control device 1 corresponding to the identification information attached to the control disabling notification, and no longer performs unnecessary communications.

The flow rate control device 1 may be powered on or powered off according to the command from the higher-level controller 500 or according to turn-on or turn-off of a power supply of the higher-level controller 500. In these cases, the CPU 21 may omit transmitting the control enabling notification or control disabling notification.

<Gas Replacement Processing>

Figure 3:
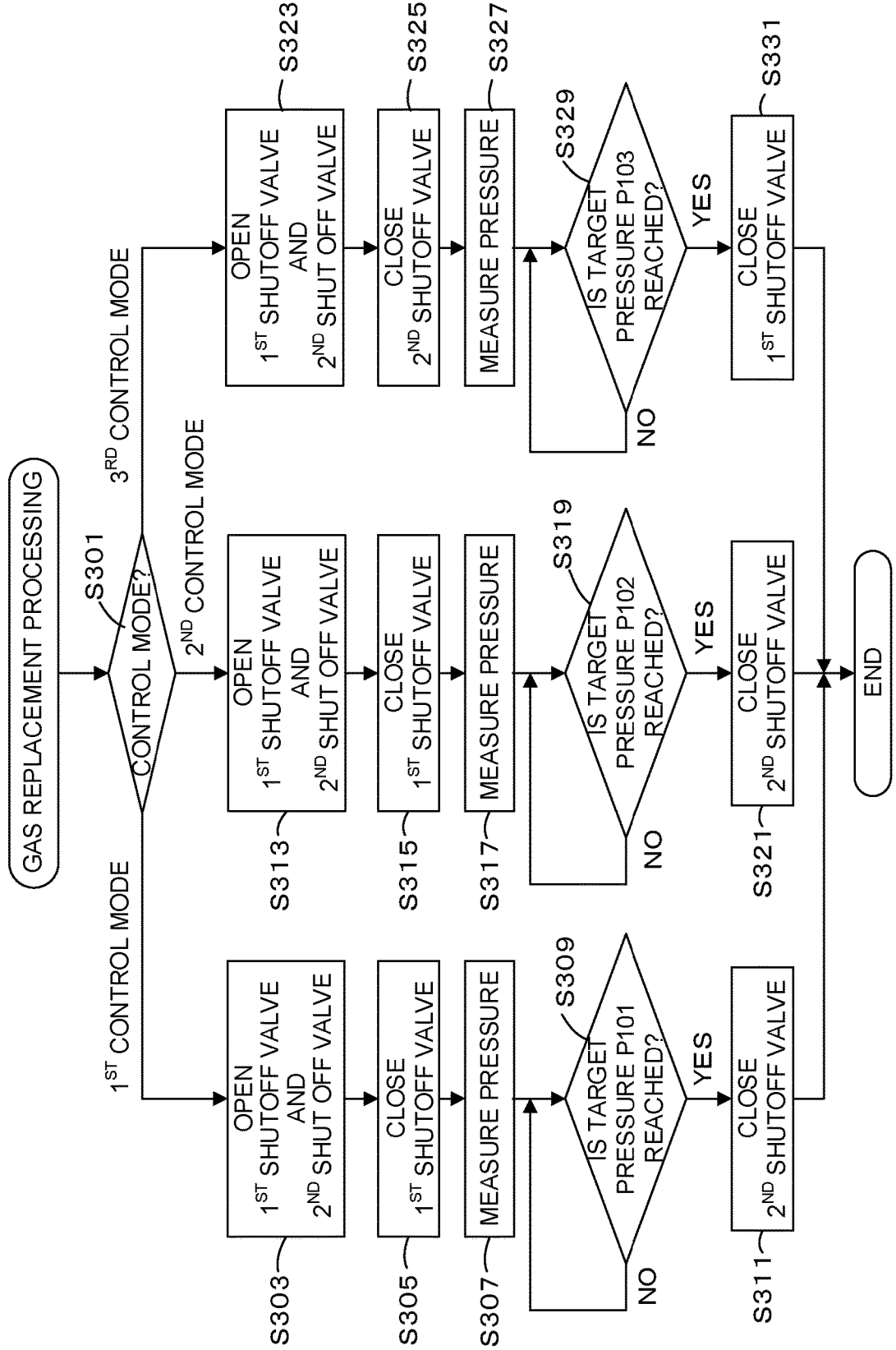
FIG. 3 is a flowchart describing the steps of a gas replacement processing.

Next, the foregoing gas replacement processing will be described below. FIG. 3 is a flowchart describing the steps of the gas replacement processing. When executing the gas replacement processing, the CPU 21 determines the control mode (S301). The higher-level controller 500 attaches a control mode for controlling a flow rate to the gas replacement command. The gas replacement command is also accompanied by a target pressure in the tank 12 for the flow rate control.

Figure 4A:
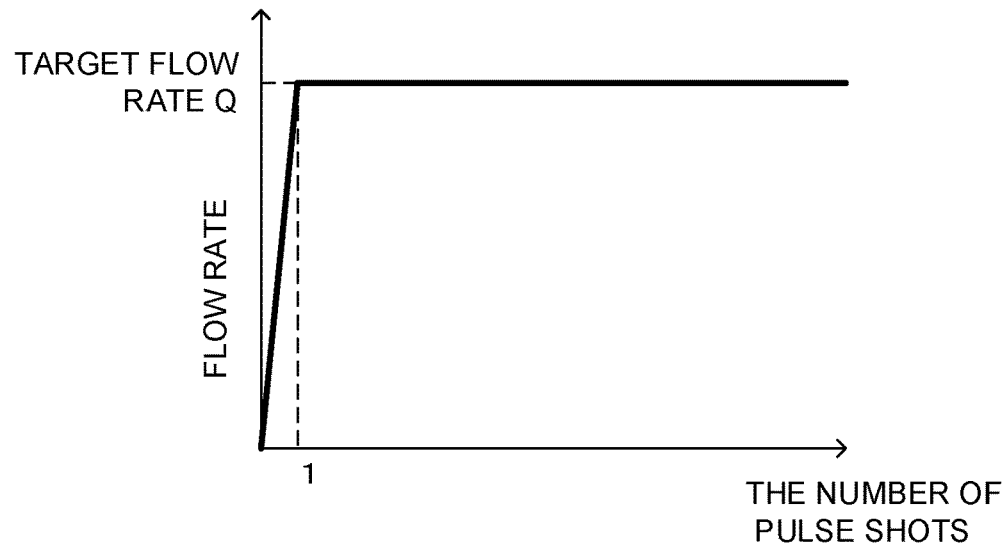
FIG. 4A is one example of a control mode.
Figure 4B:
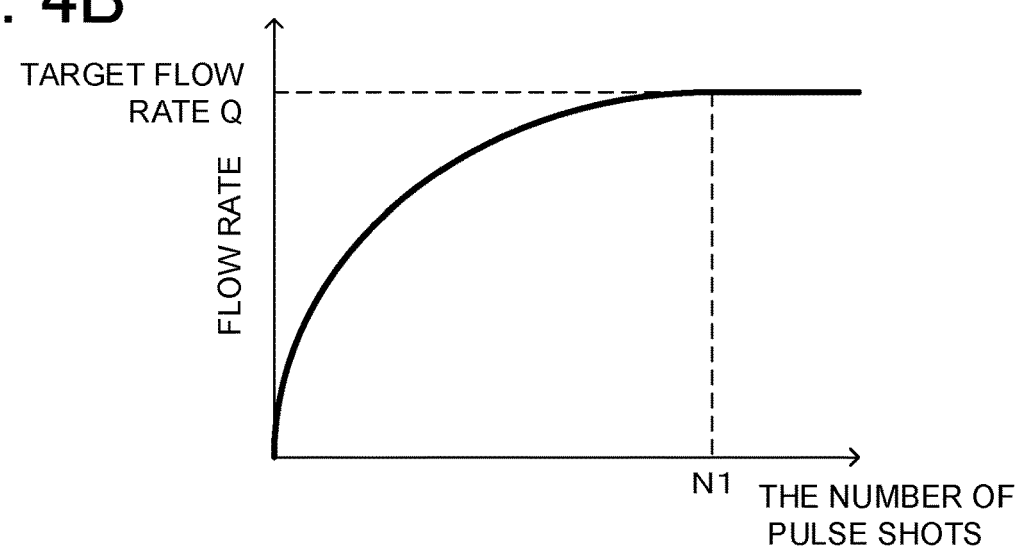
FIG. 4B is one example of a control mode.
Figure 4C:
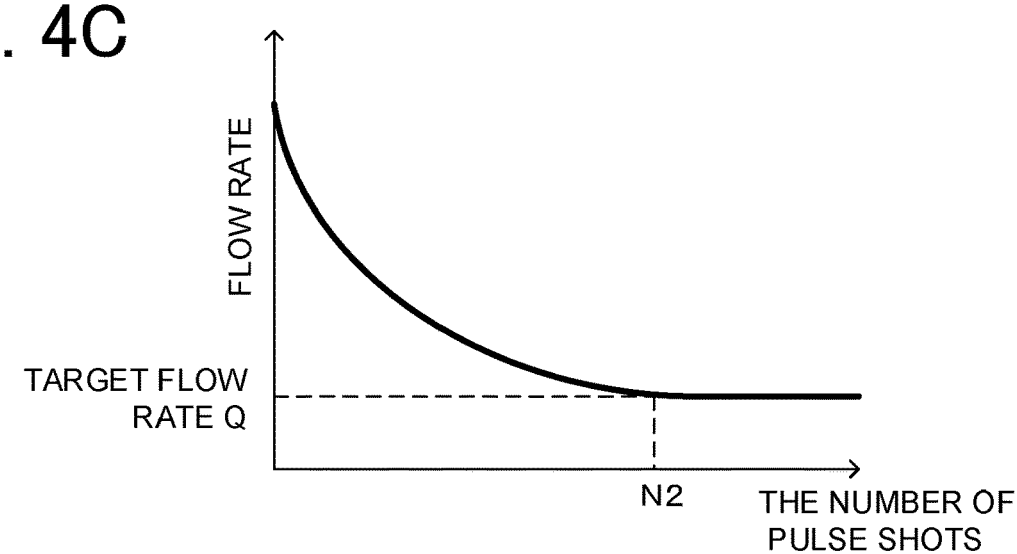
FIG. 4C is one example of a control mode.

FIGS. 4A, 4B, and 4C are one examples of the control mode. For example, the control mode includes the first to third control modes. The first control mode shown in FIG. 4A is a mode of controlling the flow rate of gas to reach to a target flow rate Q from the first ($1^{st}$-time) pulse shot in the process. The second control mode shown in FIG. 4B is a mode of controlling the gas flow rate to gradually increase until the N1-th time pulse shot, and reach to the target flow rate Q. The third control mode shown in FIG. 4C is a mode of controlling the gas flow rate to gradually decrease until the N2-th time pulse shot, and reach to the target flow rate Q. N1 and N2 are natural numbers equal to or larger than 2. N1 and N2 may be fixed values that are fixed in advance, variable values that can be set arbitrarily, or variable values that can be changed arbitrarily.

Returning to FIG. 3, if the CPU 21 determines that the control mode is the first control mode (S301: First control mode), the CPU 21 causes both the first shutoff valve 11 and the second shutoff valve 13, which are closed, to simultaneously open (S303). When the gas replacement command is to be transmitted to the flow rate control device 1, the higher-level controller 500 activates the vacuum pump 240. Thus, a pressure difference occurs between the gas source 211 and the chamber 230, causing the gas remaining in the pipe 200, tank 12, and chamber 230 to flow to the vacuum pump 240 and exhausted therefrom. Accordingly, for example, the gas mixed with air that remains in the pipe 200, tank 12, and chamber 230 is replaced with the gas supplied from the gas source 211. At that time, the time required for gas replacement can be short because the first shutoff valve 11 and the second shutoff valve 13 have large Cv values.

Thereafter, while keeping the second shutoff valve 13 opened, the CPU 21 closes the first shutoff valve 11 (S305). This gradually decreases the pressure in the tank 12. The CPU 21, after closing the first shutoff valve 11, measures the pressure in the tank 12 through the pressure sensor 14 (S307). The CPU 21 determines whether or not the pressure measured by the pressure sensor 14 reaches a target pressure P101 of the first control mode attached to the gas replacement command (S309).

When it is determined that the target pressure P101 is not reached (S309: NO), the CPU 21 waits for the pressure to reach the target pressure P101. In contrast, when it is determined that the target pressure P101 is reached (S309: YES), the CPU 21 closes the second shutoff valve 13 (S311) while keeping the first shutoff valve 11 closed. Then, the CPU 21 terminates the processing.

In contrast, when the CPU 21 determines that the control mode is the second control mode (S301: Second control mode), the CPU 21 executes the foregoing processings in S313 to S321. The processings in S313 to S321 are the same as those in S303 to S311 described above and thus their details are omitted. The target pressure P102 is a target pressure in the second control mode attached to the gas replacement command and may be the same value as or a different value from the target pressure P101 in the first control mode.

In contrast, when the CPU 21 determines that the control mode is the third control mode (S301: Third control mode), the CPU 21 simultaneously causes the first shutoff valve 11 and the second shutoff valve 13 to open (S323) as in S303 mentioned above. Then, the CPU 21 causes the second shutoff valve 13 to close while keeping the first shutoff valve 11 opened (S325). Accordingly, the pressure in the tank 12 gradually rises. After closing the second shutoff valve 13, the CPU 21 measures the pressure in the tank 12 by use of the pressure sensor sensor 14 (S327). The CPU 21 determines whether or not the pressure measured by the pressure sensor 14 reaches the target pressure P103 in the third control mode attached to the gas replacement command (S329).

When it is determined that the target pressure P103 is not reached (S329: NO), the CPU 21 waits until the target pressure P103 is reached. In contrast, when it is determined that the target pressure P103 is reached (S329: YES), the CPU 21 closes the first shutoff valve 11 while keeping the second shutoff valve 13 closed (S331). Thus, the CPU 21 terminates the processing.

Conventional gas replacement would be performed by a method in which either the first shutoff valve 11 or the second shutoff valve 13 is always held in a closed state. This method however requires a long gas replacement time to replace gas. In contrast, in the flow rate control device 1 in the present embodiment, in performing the gas replacement, the first shutoff valve 11 and the second shutoff valve 13 are caused to open at the same time to replace the gas in the pipe 200 and the tank 12. Specifically, the flow rate control device 1 in the present embodiment is provided with the first shutoff valve 11 connected to the gas source 211, the second shutoff valve 13 connected to the first shutoff valve 11, the tank 12 (the gas filling capacity) between the first shutoff valve 11 and the second shutoff valve 13, the pressure sensor 14 for measuring the pressure in the tank 12, and the CPU 21 (the controller). The CPU 21 repeats a pulse shot of causing the first shutoff valve 11 and the second shutoff valve 13 to open and close and further calculates the volume flow rate of gas to exhausted from the tank 12 based on the pressure after filling and the pressure after discharge, which are measured by the pressure sensor 14. Furthermore, the CPU 21 changes the manner of repeating the pulse shot to regulate the volume flow rate of the gas to be exhausted through the second shutoff valve 13 to the target flow rate. In the above-described pulse shot-type flow rate control device, the CPU 21 causes the first shutoff valve 11 and the second shutoff valve 13 to open at the same time to perform the gas replacement processing to replace the gas in the tank 12 with the gas supplied from the gas source 211. In this flow rate control device 1, the inner pressure of the gas filling capacity does not need to be adjusted to a set pressure during the gas replacement, differently from during the flow rate control. Thus, since the first shutoff valve 11 and the second shutoff valve 13 are caused to simultaneously open, allowing the gas supplied from the gas source 211 to continue to flow in the gas filling capacity to perform gas replacement, this gas replacement can be performed more quickly than in the gas replacement using the method in which either the first shutoff valve 11 or the second shutoff valve 13 is always held in the closed state. In particular, the first shutoff valve 11 and the second shutoff valve 13 of the flow rate control device 1 are designed with larger Cv values than that of a valve commonly used in a pipe. This can reduce the time for gas replacement of the tank 12.

Even if the original pressure in the gas source 211 changes, the flow rate control device 1 adjusts the pressure in the tank 12, after gas replacement, to a corresponding one of the target pressures P101 to P103 according to the first to third control modes. This configuration can reduce variations in pressure in the tank 12 during execution of the process in the first to third control modes, and can be expected to improve the response of the flow rate control.

It is to be noted that the processings in S303, S313, and S323 are one examples of a "replacement processing". The processings in S309 to S311, S319 to S321, and S329 to S331 are one examples of a "pressure regulating processing". The target pressures P101 to P103 in the first to third control modes are not limited to those attached to the gas replacement commands. For example, for the flow rate control device 1 provided with an operating unit, the target pressures P101 to P103 may be received through the operating unit.

<Flow Rate Control Processing>

Figure 5:
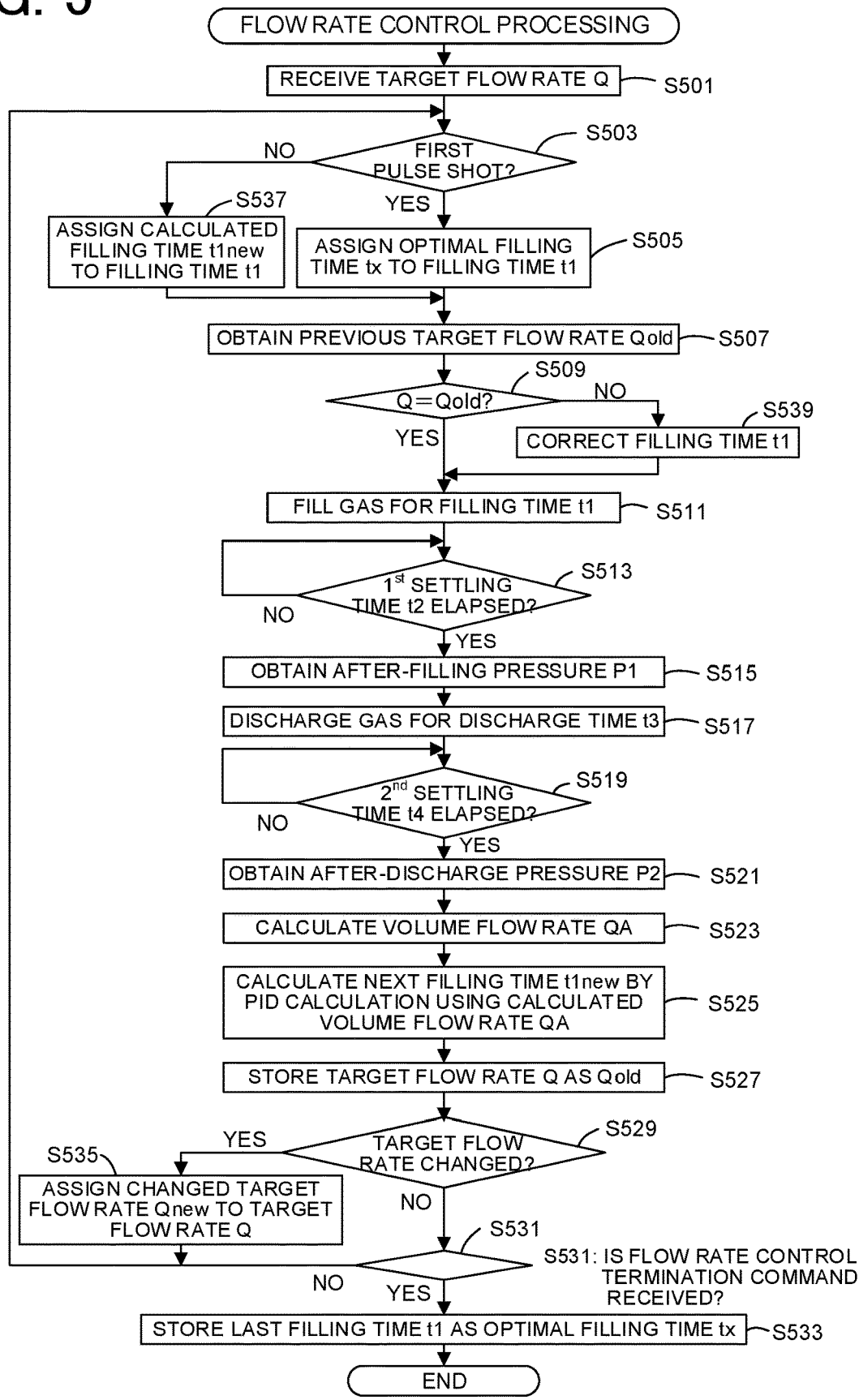
FIG. 5 is a flowchart describing the steps of a flow rate control processing.

The foregoing flow rate control processing will be described below. FIG. 5 is a flowchart describing the steps of the flow rate control processing. The steps shown in FIG. 5 are intended to improve the response in the first control mode.

When starting the flow rate control processing upon receipt of a flow rate control start command from the higher-level controller 500, the CPU 21 first receives a target flow rate Q as shown in FIG. 5 (S501). The higher-level controller 500 attaches the target flow rate Q for supply of gas to the chamber 230 to the flow rate control start command. When the CPU 21 receives the flow rate control start command transmitted from the higher-level controller 500 through the communication IF 24, the CPU 21 stores the target flow rate Q attached to the flow rate start command into the memory 22. In the case of the flow rate control device 1 provided with the operating unit, the CPU 21 may store, into the memory 22, the target flow rate Q input through the operating unit.

After receipt of the target flow rate Q, the CPU 21 determines whether or not it is a first pulse shot (S503). In the present description, the "first pulse shot" is defined as a pulse shot executed first after the flow rate control start command is received.

When it is the first pulse shot (S503: YES), the CPU 21 assigns an optimal filling time tx stored in the memory 22 to a filling time t1 (S505). The filling time t1 is the time for supplying gas into the tank 12 in the current, i.e., this-time, pulse shot while keeping the first shutoff valve 11 open. Further, the CPU 21 obtains a previous, i.e., last, target flow rate Qold stored in the memory 22 (S507). The processings in S505 and S507 may be performed in reverse order.

Subsequently, in 509, the CPU 21 determines whether or not the target flow rate Q received in S501 is equal to the previous target flow rate Qold obtained in S507. When those values are determined to be the same (S509: YES), the CPU 21 supplies gas into the tank 12 for the filling time t1 (S511). At the start of the flow rate control processing, specifically, the first shutoff valve 11 and the second shutoff valve 13 are in a closed state. Thus, the CPU 21 opens the first shutoff valve 11 and starts filling gas into the tank 12. The CPU 21 measures, using the timer 23, a first opening-operation maintaining time for keeping the first shutoff valve 11 open. The CPU 21 keeps the first shutoff valve 11 open until the first opening-operation maintaining time obtained in S503 reaches the filling time t1. When the CPU 21 detects, using the timer 23, that the filling time t1 has elapsed, the CPU 21 causes the first shutoff valve 11 to close and terminates filling of the gas. Concurrently with the termination of gas filling, the CPU 21 resets the timer 23.

The CPU 21, after completion of gas filling, determines whether or not a first settling time t2 has elapsed (S513). The pressure in the tank 12 immediately after gas filling is unstable due to adiabatic compression. Further, the response of the first shutoff valve 11 may also delay. Thus, the first settling time t2 is provided for a period after the first shutoff valve 11 is closed but before the second shutoff valve 13 is opened. In the present embodiment, the discharge time to discharge gas through the second shutoff valve 13 is set equal to the time from when the second shutoff valve 13 is closed to when the first shutoff valve 11 is opened. The cycle from when the first shutoff valve 11 is opened to when the first shutoff valve 11 is opened next time is set constant. Thus, when the filling time t1 is determined, the first settling time t2 is automatically determined. After closing the first shutoff valve 11, the CPU 21 starts measuring time with the timer 23. When the time measured with the timer 23 does not reach the first settling time t2, the CPU 21 determines that the first settling time t2 has not elapsed (S513: NO), and waits.

In contrast, when the time measured with the timer 23 reaches the first settling time t2, the CPU 21 determines that the first settling time t2 has elapsed (S513: YES). Then, the CPU 21 obtains a pressure after filling (an after-filling pressure) P1 (S515). Specifically, the CPU 21 measures the pressure in the tank 12 with the pressure sensor 14 when the first settling time t2 has elapsed, and temporarily stores the measured pressure as the after-filling pressure P1 in the memory 22.

After obtaining the after-filling pressure P1, the CPU 21 discharges gas through the second shutoff valve 13 for a discharging time t3 (S517). The discharging time t3 is determined in advance as described above. Specifically, right after obtaining the after-filling pressure P1 after closing the first shutoff valve 11, the CPU 21 causes the second shutoff valve 13 to open. The CPU 21 measures, using the timer 23, a second opening-operation maintaining time for keeping the second shutoff valve 13 open. The CPU 21 keeps the second shutoff valve 13 open until the second opening-operation maintaining time reaches the discharging time t3. After a lapse of the discharging time t3, the CPU 21 causes the second shutoff valve 13 to close and terminates discharge of the gas. Concurrently with the termination of gas discharge, the CPU 21 resets the timer 23.

The CPU 21, after the termination of gas discharge, determines whether or not a second settling time t4 has elapsed (S519). The pressure in the tank 12 immediately after gas discharge is unstable due to adiabatic expansion. Further, the closing response of the second shutoff valve 13 may also delay. Thus, the second settling time t4 is provided for a period after the second shutoff valve 13 is closed but before the first shutoff valve 11 is opened. The second settling time t4 is determined in advance as described above. After closing the second shutoff valve 13, the CPU 21 starts measuring time with the timer 23. When the time measured with the timer 23 does not reach the second settling time t4, the CPU 21 determines that the second settling time t4 has not elapsed (S519: NO), and waits.

In contrast, when the time measured with the timer 23 reaches the second settling time t4, the CPU 21 determines that the second settling time t4 has elapsed (S519: YES). Then, the CPU 21 obtains a pressure after discharge (an after-discharge pressure) P2 (S515). Specifically, the CPU 21 measures the pressure in the tank 12 with the pressure sensor 14 when the second settling time t4 has elapsed, and temporarily stores the measured pressure as the after-discharge pressure P2 in the memory 22.

The CPU 21 calculates a volume flow rate QA discharged through the second shutoff valve 13 by the relevant pulse shot (S523). In other words, the flow rate control device 1 obtains, using the following equation 1, the current volume flow rate QA, per unit time, of the gas discharged through the second shutoff valve 13.

Volume flow rate=Discharge amount×The number of pulse shots (Equation 1)

The number of pulse shots is determined based on the time of a process and the cycle of pulse shots. The discharge amount is obtained by the following equation 2, wherein $\Delta P$ is a pressure difference, P is an atmospheric pressure (101.3 kPa), V is a volume (cc) of the tank 12, and T is a fluid temperature (°C.). T denotes the temperature of gas supplied to the chamber 230.

Discharge amount=$\Delta P/P \times V \times 273/(273+T)$ (Equation 2)

ΔP: Pressure difference=P1—P2 [kPa]
P: Atmospheric pressure=101.3 [kPa]
V: Tank volume [cc]
T: Fluid temperature [° C.]

In the flow rate control device 1, P and V are specified values. For example, if T is set to 20° C., the discharge amount shall be calculated by 20° C. conversion. The pressure difference ΔP is a difference between the after-filling pressure P1 obtained in S515 and the after-discharge pressure P2 obtained in S521. Thus, the discharge amount varies according to the pressure difference ΔP between the after-filling pressure P1 and the after-discharge pressure P2.

The CPU 21 substitutes the after-filling pressure P1 and the after-discharge pressure P2, which are temporarily stored in the memory 22 in S515 and S521, into the equation 2 described above to calculate the discharge amount. The CPU 21 assigns the number of pulse shots in the relevant process to the number of pulse shots in the equation 1, and further multiplies the number by the discharge amount obtained in the equation 2 to calculate the volume flow rate QA.

Subsequently, in S525, the CPU 21 calculates a next filling time t1new by PID calculation using the volume flow rate QA calculated in S521.

Figure 6:
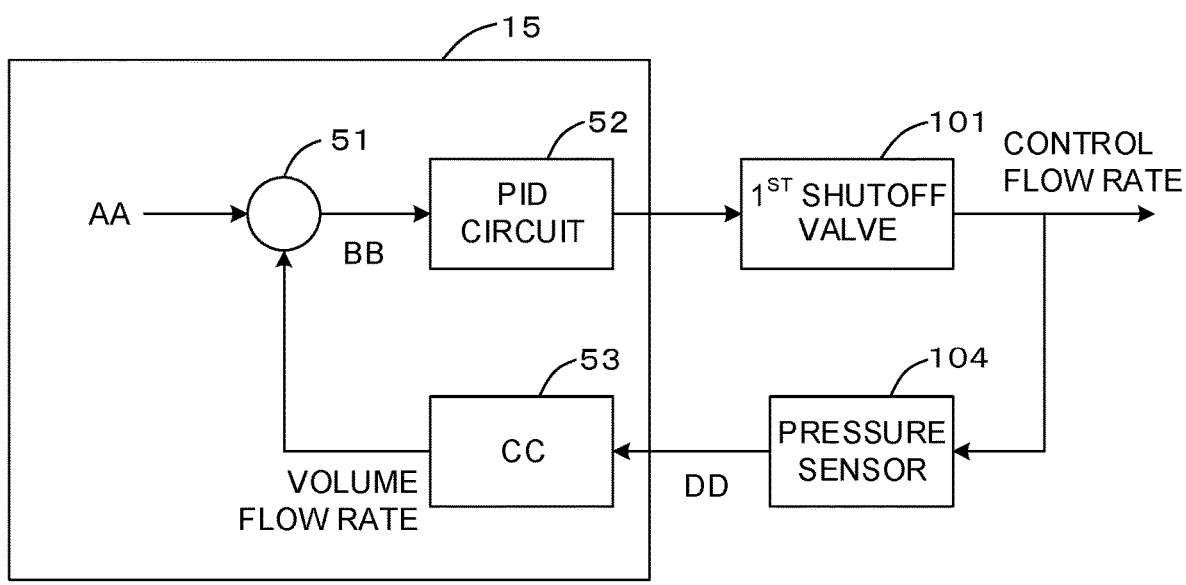
FIG. 6 is a functional block diagram of a controller.

The PID calculation processing will be described referring to FIG. 6. FIG. 6 is a functional block diagram of the controller 15. The controller 15 is provided with a volume flow rate calculation circuit 53 for calculating a volume flow rate QA based on the after-filling pressure P1 and the after-discharge pressure P2. The volume flow rate calculation circuit 53 outputs the calculated volume flow rate QA to a deviation calculation unit 51. This deviation calculation unit 51 retrieves the target flow rate Q received in S501 and compares it with the volume flow rate QA transmitted from the volume flow rate calculation circuit 53, and obtains a control deviation that corresponds to a difference between the target flow rate Q and the volume flow rate QA. The deviation calculation unit 51 outputs the obtained control deviation to a PID calculation circuit 52. The PID calculation circuit 52 calculates a next filling time t1new by the following equation 3 based on the control deviation transmitted from the deviation calculation unit 51. In the equation 3, Kp is a proportional constant, Ki is an integral constant, Kd is a derivative constant, e(t) is a current deviation, and e(t−1) is a previous deviation.

$$t1new \rightarrow t1 + Kp*e(t) + Ki*\int_0^t e(t)dt + Kd*(e(t)-e(t-1))$$ (Equation 3)

Kp: Proportional constant
Ki: Integral constant
Kd: Derivative constant
e(t): Current deviation
e(t−1): Previous deviation For the tank 12, the filling amount of gas to be supplied to the tank 12 is adjusted by the opening/closing operations of the first shutoff valve 11. Thus, when the discharge time t3 and the second settling time t4 are constant, changing of the filling time t1 can regulate the volume flow rate QA of gas to be exhausted through the second shutoff valve 13. As above, the next filling time t1new is calculated and the manner of the current pulse shot is replaced by the manner of the next pulse shot, so that the volume flow rate QA comes closer to the target flow rate Q.

Returning to FIG. 5, after calculating the next filling time t1new in S525, the CPU 21 overwrites the previous target flow rate Qold with the target flow rate Q used for the pulse shot, and stores the target flow rate Q in the memory 22 (S527). The CPU 21 then determines whether or not the target flow rate Q has been changed (S529). When the target flow rate Q has not been changed (S529: NO), the CPU 21 determines whether or not a flow rate control termination command is received (S531). Specifically, when the CPU 21 receives, through the communication IF 24, the flow rate control termination command transmitted from the higher-level controller 500, the CPU 21 determines that the flow rate control termination command is received. When not received, the CPU 21 determines that flow rate control termination command is not received. In the case of the flow rate control device 1 provided with the operating unit, the CPU 21 may receive the flow rate control termination command through the operating unit. As an alternative, the CPU 21, after registering the process time and receives the flow rate control start command, may automatically determine that the flow rate control termination command is received, after a lapse of the process time.

When it is determined that the flow rate control termination command is not received (S531: NO), the CPU 21 returns to the processing in S503 and determines whether or not the pulse shot is the first pulse shot. Since it is not the first pulse shot at this point (S503: NO), the CPU 21 assigns the next filling time t1new calculated in S525 to the filling time t1 (S537). Accordingly, the filling time t1 for the current pulse shot is changed from the filling time t1 used in the previous pulse shot, thus changing the manner of the pulse shot. Thereafter, the CPU 21 advances to S507. The processings in S507 and subsequent steps are the same as above and their details are omitted.

Since the CPU 21 repeats pulse shots to execute the processings in S503 to S531 and S537, the accuracy of adjusting the volume flow rate to the target flow rate can be improved.

When it is determined that the flow rate control termination command is received (S531: YES), the CPU 21 stores the filling time t1 used in the last pulse shot as an optimal filling time tx in a non-volatile memory of the memory 22 (S533). In other words, the optimal filling time tx stored in the previous process is rewritten with the filling time t1 used in the last pulse shot of the current process. The CPU 21 then terminates the processing.

When the CPU 21 receives a flow rate control command for the next process and executes the flow rate control processing, the CPU 21 performs a first pulse shot in this next process by use of the filling time t1 having been used in the last pulse shot in the previous process. Thus, in that next pulse shot, there is a high possibility that the flow rate of gas exhausted through the second shutoff valve 13 is regulated to the target flow rate Q from the first pulse shot. The flow rate control device 1 can therefore shorten the response time from receiving the flow rate control command to adjusting the gas flow rate to the target flow rate Q.

The flow rate control processing shown in S50 in FIG. 2 and the processing shown in FIG. 5 are one examples of a "control mode". The processing in S533 in FIG. 5 is one example of an "optimal filling time storage processing. The processing in S505 is one example of a "filling time control processing".

Meanwhile, as described above, for gasses generated by evaporation of solid material, such as TMA, the evaporation amount of the solid material may change depending on the reduced amount of solid material. Further, the original pressure in the gas source 211 may also change. Specifically, the gas usage conditions may change from process to process or during a process. In those cases, the higher-level controller 500 changes the target flow rate Q according to changes in gas usage condition in order to stabilize the molecular weight of gas to be supplied to the chamber 230.

After the target flow rate Q is changed, if the CPU 21 uses the filling time t1 calculated in a pulse shot executed before change of the target flow rate Q, there is a risk that the gas may not be adjusted to the updated target flow rate. Therefore, the CPU 21 performs a correction to change the filling time t1 according to the changed target flow rate Q. In this case, the CPU 21 adjusts the filling time t1 by use of a correction graph stored in the memory 22 in a learning processing mentioned later to shorten the time for the correction.

Specifically, upon receipt of a flow rate control command, for example, if the target flow rate Q in the current process is different from the target flow rate Qold in the previous process (S509: NO), the CPU 21 corrects the filling time t1 (S539).

When the target flow rate Q is changed to a target flow rate Qnew during the current process (S529: YES), the CPU 21 assigns the changed target flow rate Qnew to the target flow rate Q (S535). Then, the CPU 21 performs the foregoing processings in S503 to S509 and S537. In the processing in S509, the CPU 21 determines that the target flow rate Q is different from the previous target flow rate Qold (S509: NO), and corrects the filling time t1 (S539).

Figure 7A:
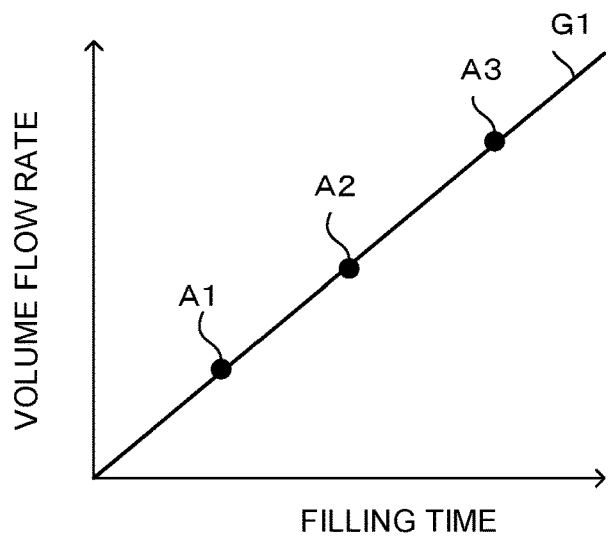
FIG. 7A is a conceptual diagram describing the steps of correction.

The correction of the filling time t1 will be described referring to FIGS. 7A, 7B, and 7C. The memory 22 has stored the correction graph created in the learning processing described later. To correct the filling time t1, the CPU 21 reads for example a correction graph G1 shown in FIG. 7A from the memory 22. The correction graph G1 is a graph showing the relationship between the volume flow rate and the filling time. The CPU 21 obtains a filling time associated to the volume flow rate corresponding to the target flow rate Q in the read correction graph G1, and replaces the filling time t1 with the obtained filling time. When the target flow rate Q is less than the previous target flow rate Qold, accordingly, the filling time t1 is shortened according to the deviation. In contrast, when the target flow rate Q is higher than the previous target flow rate Qold, the filling time t1 is increased according to the deviation.

Figure 7B:
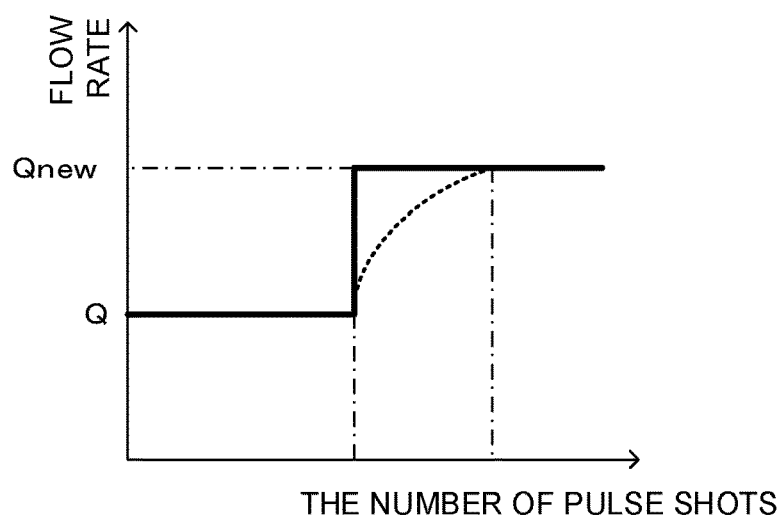
FIG. 7B is a conceptual diagram describing the steps of correction.
Figure 7C:
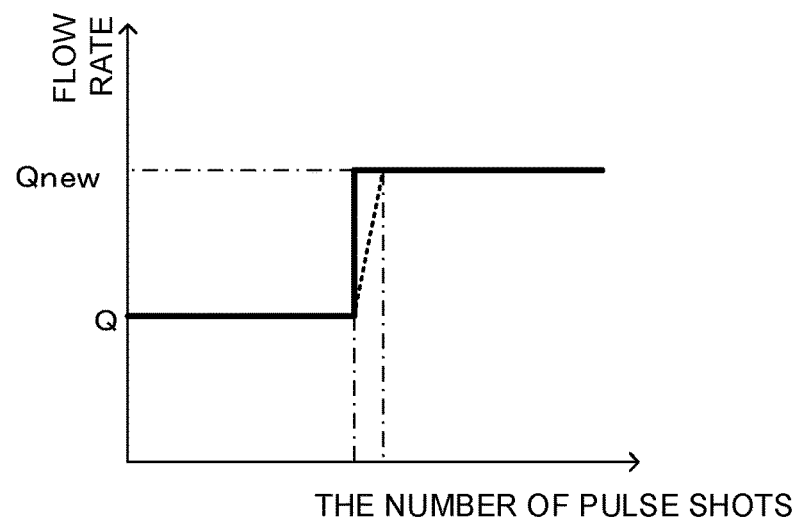
FIG. 7C is a conceptual diagram describing the steps of correction.

Since the filling time t1 is corrected as above, the number of pulse shots required to change the gas flow rate from the target flow rate Q before change to the changed target flow rate Qnew is smaller when the correction is made as shown in FIG. 7C than when the correction is not made as shown in FIG. 7B. In other words, the CPU 21 can change, with high responsiveness, the volume flow rate of gas to be exhausted through the second shutoff valve 13 according to the changed target flow rate Q. The processing in S539 is one example of a "correction processing".

<Learning Processing>

Figure 8:
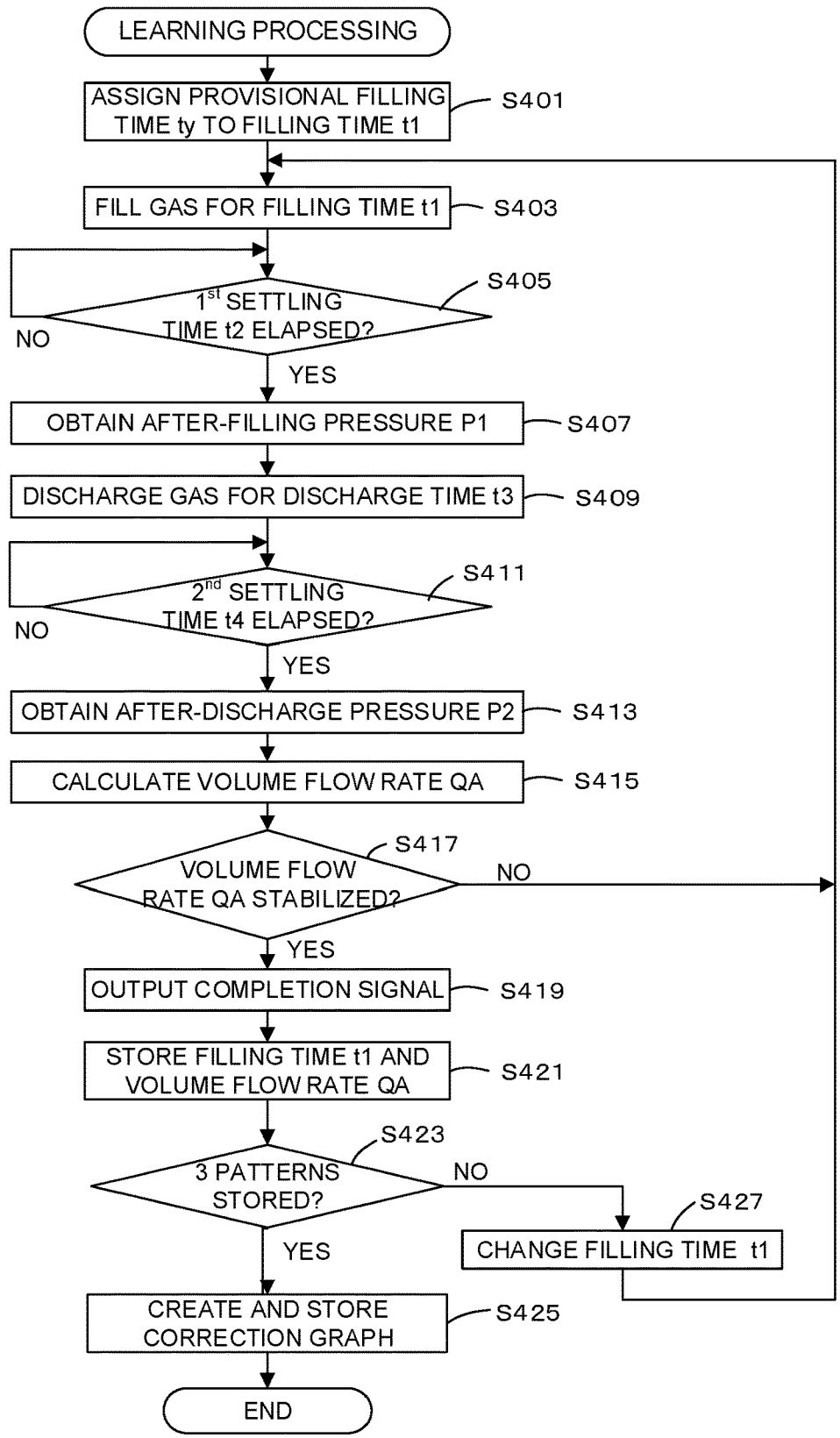
FIG. 8 is a flowchart describing the steps of a learning processing.
Figure 9:
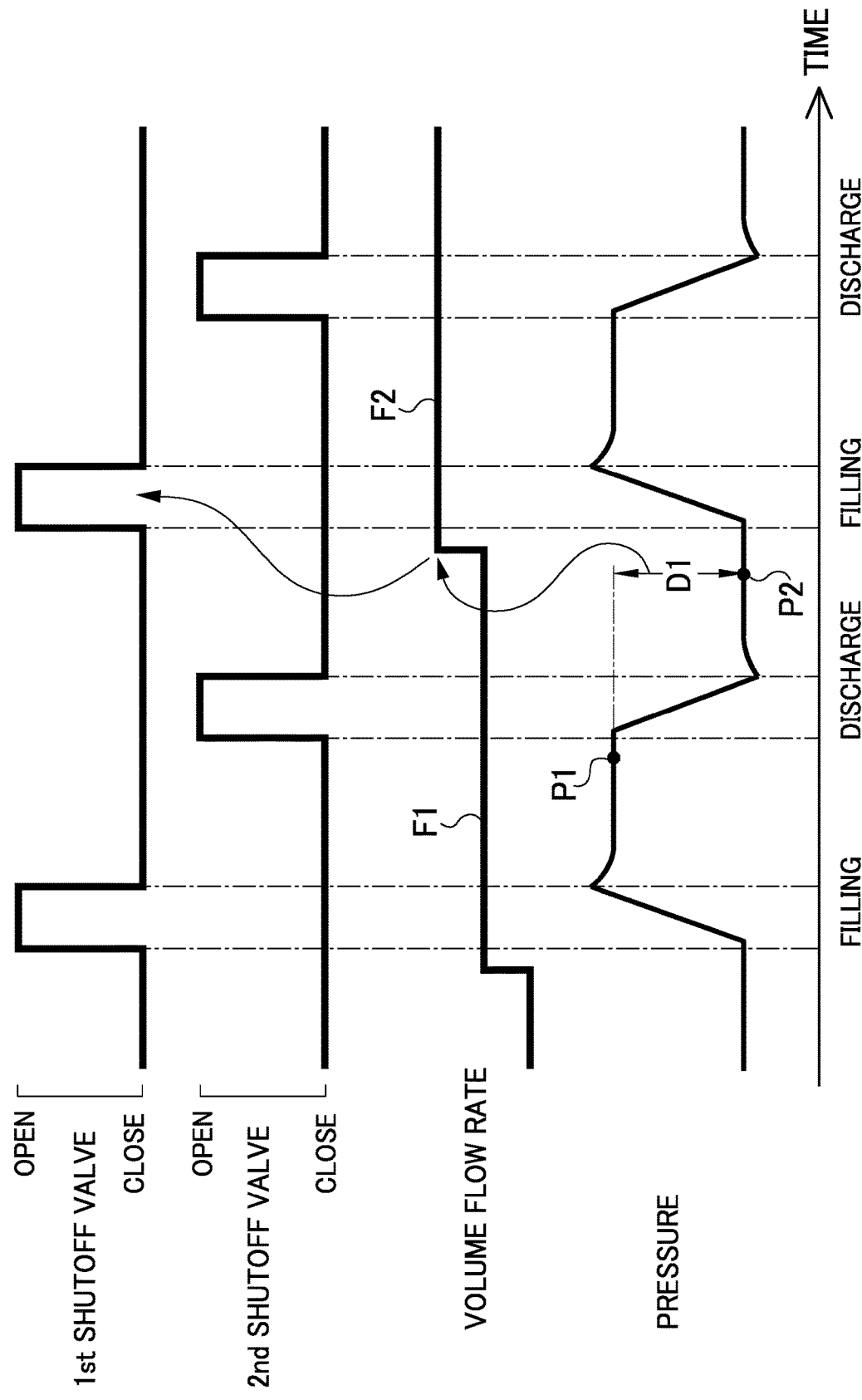
FIG. 9 is a sequence diagram of a conventional pulse shot-type flow rate control device.
Figure 10:
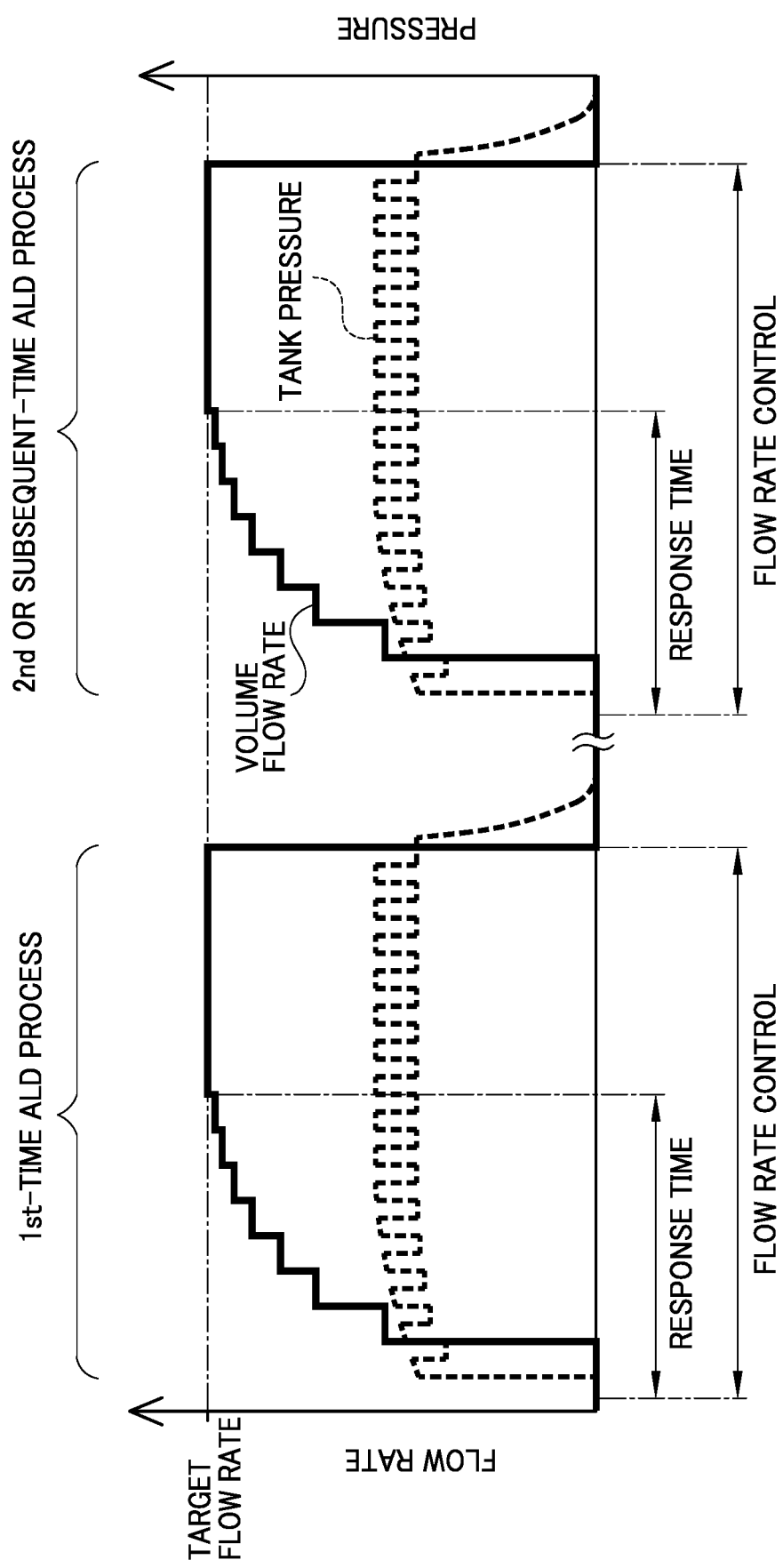
FIG. 10 is a diagram showing an example of flow rate control in the conventional pulse shot-type flow rate control device.

The foregoing learning processing will be described below. FIG. 8 is a flowchart to explain the steps of the learning processing. The processing shown in FIG. 8 is one example of the "learning processing".

The CPU 21 first assigns a provisional filling time ty to a filling time t1 (S401). This provisional filling time ty may also be for example the optimal filling time tx stored in the memory 22. The provisional filling time ty may also be one attached to a learning command transmitted by the higher-level controller 500. Alternatively, the provisional filling time ty may also be specified in the control program 31.

The CPU 21 executes the processings in S403 to S415 based on the filling time t1 acquired in S401, in a similar manner to the processings in S511 to S523 shown in the flow rate control processing in FIG. 5. The details of the processings in S403 to S415 will be omitted.

After calculating the volume flow rate QA in the processing in S415 shown in FIG. 8, the CPU 21 determines whether or not the volume flow rate QA has stabilized (S417). That is, the CPU 21 determines whether or not the volume flow rate has stabilized based on the volume flow rate QA calculated in the processing in S415 and the volume flow rate QA calculated earlier in the learning processing. When a change rate of the volume flow rate QA calculated this time relative to the volume flow rate QA calculated earlier exceeds for example a predetermined threshold value, the CPU 21 determines that the volume flow rate QA has not stabilized yet (S417: NO). In this case, the CPU 21 repeats the processings in S403 and subsequent steps. In this learning processing, therefore, the volume flow rate QA corresponding to the filling time t1 is stored and accumulated in the memory 22.

When the change rate at which the volume flow rate QA calculated this time has changed relative to the volume flow rate QA calculated earlier is equal to or less than the predetermined threshold value, for example, the CPU 21 determines that the volume flow rate QA has stabilized (S417: YES). In this case, the CPU 21 outputs a completion signal (S419). That is, the CPU 21 transmits a completion signal to the memory 22, indicating that acquisition of a pattern is complete. The memory 22 has stored the number of patterns ("3" in the present embodiment) that need to be acquired in the learning processing. Upon receiving the completion signal, the memory 22 deducts 1 from the number of patterns. This enables the CPU 21 to determine how many more times the foregoing processings need to be repeated. The number of patterns is not limited to "3" only if it is 2 or more.

The CPU 21 stores the filling time t1 and the volume flow rate QA in the memory 22 (S421). In other words, the CPU 21 associates the filling time t1 used in acquiring the relevant pattern and the volume flow rate QA calculated just before transmitting the completion signal, and stores them in the memory 22 as a pattern A1, for example, as shown in FIG. 7A.

Returning to FIG. 8, the CPU 21 determines whether or not the CPU 21 has stored, i.e., three patterns (S423). Specifically, the CPU 21 determines whether or not the number of patterns, stored in the memory 22, that should be acquired in this learning processing is 0.

If the number of patterns that needs to be acquired in this learning processing is not 0, the CPU 21 determines that three patterns have not been stored yet (S423: NO). In this case, the CPU 21 receives a change of the filling time t1. This change of the filling time t1 may be performed according to a change condition programmed in advance in the control program 31 or may be carried out by a command from the higher-level controller 500. In the case of the flow rate control device 1 provided with the operating unit, the filling time t1 may be changed according to a change command input by a user with the operating unit.

Subsequently, the CPU 21 returns to the processing in S403. The CPU 21 performs the foregoing processings in S403 and subsequent steps based on the changed filling time t1. Thus, the CPU 21 stores for example a pattern A2 in the memory 22, which is different from the pattern A1, as shown in FIG. 7A.

Returning to FIG. 8, the CPU 21 repeats the foregoing processings and, if the number of patterns needing to be acquired in this learning processing reaches 0, the CPU 21 determines that three patterns have been stored (S423: YES). In this case, the CPU 21 creates a correction graph and stores it in the memory 22 (S425). Specifically, the CPU 21 creates the correction graph G1 showing the relationship between the filling time and the volume flow rate based on the three patterns A1 to A3 stored in the memory 22, as shown in FIG. 7A, and stored the graph G1 in the memory 22. Then, the CPU 21 terminates the learning processing.

Accordingly, the flow rate control device 1 obtains the correction graph G1 suitable for the properties of the device itself and can utilize it in S539 for the flow rate control processing shown in FIG. 5.

The flow rate control device 1 in the present embodiment, as described above, causes the first shutoff valve 11 to open and close in the first pulse shot to execute a process with the optimal filling time tx stored in a previous process. By the first pulse shot, therefore, the tank 12 is filled with gas appropriate to adjust the volume flow rate QA of gas to be exhausted through the second shutoff valve 13 to the target flow rate Q, so that the volume flow rate QA of gas discharged through the second shutoff valve 13 is likely to be adjusted to the target flow rate Q or any value close to the target flow rate Q. Consequently, the flow rate control device 1 can shorten the response time from the start of the process until the gas has stabilized at the target flow rate, thus achieving improved response.

The present invention is not limited to the foregoing embodiments and may be embodied in other specific forms. The chamber 230 may form a film on a wafer by any other methods than the ALD. Further, the flow rate control device 1 may be applied to any devices, not limited to semiconductor production devices.

For example, the optimum filling time tx to be stored in S533 in FIG. 5 does not necessarily have to be a filling time t1 in the last pulse shot in the previous process. For example, the filling time t1 may be stored in association with the volume flow rate and the pressure in the tank 12 in each pulse shot in the previous process, and the filling time t1 associated with the pressure in the tank 12 most approximate to the target pressure in the next process may be set as an optimal filling time tx. However, a last pulse shot is considered to be closest in gas usage conditions to a first pulse shot in a next process. Therefore, as in the above embodiment, the filling time t1 measured in the last pulse shot, by which the volume flow rate QA could likely have been adjusted to the target flow rate Q, can be stored as the optimal filling time tx, so that processing loads and memory loads in storing the optimum filling time tx can be reduced.

For example, the learning processing shown in FIG. 8 and the processing in S539 in FIG. 5 may be omitted. However, as in the above embodiment, when the target flow rate Q is changed from the target flow rate Qold used in the immediately preceding process or is changed during the flow control process, the optimum filling time is corrected according to a difference between the target flow rate and a changed target flow rate, based on the correction graph G1 showing the relationship between filling time and volume flow rate that have been learned in advance. This enables quick adjustment of a gas flow rate to the changed target flow rate.

For example, instead of the processings in S303, S313, and S323 in FIG. 3, the first shutoff valve 11 and the second shutoff valve 13 may be alternately caused to open and close to replace the gas. In the case of gas replacement as in the present embodiment, however, when the first shutoff valve 11 and the second shutoff valve 13 are opened simultaneously, the gas supplied from the gas source 211 flows into the tank 12 and easily replaces the gas remaining in the tank 12. This configuration can more quickly complete gas replacement than when the first shutoff valve 11 and the second shutoff valve 13 are alternately caused to open and close.

For example, the processings in S305-S311, S315-S321, and S325-S331 in FIG. 3 may be omitted. For example, the first shutoff valve 11 and the second shutoff valve 13 may be caused to close simultaneously to terminate the gas replacement without pressure regulation. However, in the foregoing embodiment wherein the first shutoff valve 11 and the second shutoff valve 13 are opened at the same time to replace the gas in the tank 12, and the pressure in the tank 12 is adjusted by the timing of closing the first shutoff valve 11 and the second shutoff valve 13 to a target pressure in the tank 12 for executing the flow rate control processing, the pressure in the tank 12 is already controlled to the target pressure before the first pulse shot in the process to be performed after gas replacement, so that a delay in response time due to variations in the pressure in the tank 12 can be reduced.

For example, the processing does not necessarily have to be performed according to the mode set as shown in FIG. 2. For example, the controller 15 may perform the gas replacement processing, the flow rate control processing, and the learning processing separately. However, as in the foregoing embodiment, when the flow rate control processing, the gas replacement processing, and learning processing are executed according to the set mode among the flow rate control mode, the gas replacement mode, and the learning mode, each processing can be performed at arbitrary timing and easy to use.

The processings in each of the flowcharts described in the foregoing embodiment may be performed in the different order without causing inconsistency. The storage medium for storing the control program 31 is also a novel and useful invention.

REFERENCE SIGNS LIST

1 Pulse shot-type flow rate control device
11 First shutoff valve
12 Tank
13 Second shutoff valve
14 Pressure sensor
15 Controller

The invention claimed is:

1. A pulse shot-type flow rate control device comprising:
a first shutoff valve connected to a gas source;
a second shutoff valve connected to the first shutoff valve;
a gas filling capacity between the first shutoff valve and the second shutoff valve; and
a pressure sensor for measuring a pressure in the gas filling capacity,
wherein two or more processes for controlling gas to a target flow rate are performed,
the first shutoff valve, the second shutoff valve, and the pressure sensor are connected communicatively to a controller that controls operations of the pulse shot-type flow rate control device,
in each of the processes, the controller executes a flow rate control processing of: repeating a pulse shot of causing the first shutoff valve to open and close and, after that, causing the second shutoff valve to open and close; calculating a volume flow rate of gas exhausted from the gas filling capacity based on a pressure after filling measured by use of the pressure sensor after the first shutoff valve is opened and closed to fill gas into the gas filling capacity and a pressure after discharge measured by use of the pressure sensor after the second shutoff valve is opened and closed to discharge gas from the gas filling capacity; and changing a manner of repeating the pulse shot to regulate the volume flow rate to the target flow rate, and the controller further executes:
an optimal filling time storage processing of storing, as an optimal filling time, a filling time of filling the gas into the gas filling capacity by opening and closing of the first shutoff valve when the pulse shot that regulates the volume flow rate to the target flow rate is performed in the flow rate control processing; and a filling time control processing of opening and closing the first shutoff valve with the optimal filling time stored in the optimal filling time storage processing in a first pulse shot in the flow rate control processing in a next process to be performed after the process in which the optimal filling time storage processing is executed.

2. The pulse shot-type flow rate control device according to claim 1, wherein
in the optimal filling time storage processing, the filling time in a last pulse shot is stored as the optimal filling time.

3. The pulse shot-type flow rate control device according to claim 1, wherein
the controller causes the first shutoff valve and the second shutoff valve to simultaneously open to execute replacement processing to replace gas remaining in the gas filling capacity.

4. The pulse shot-type flow rate control device according to claim 3, wherein
after the replacement processing, the controller executes a pressure regulation processing causing the first shutoff valve and the second shutoff valve that are open to close in order to regulate the pressure in the gas filling capacity to a target pressure in the gas filling capacity for execution of the flow rate control processing.

5. The pulse shot-type flow rate control device according to claim 1, wherein
the controller executes:
a learning processing of: repeating the pulse shot by changing the filling time to fill the gas into the gas filling capacity by opening and closing of the first shutoff valve, while keeping a discharge time constant to discharge the gas from the gas filling capacity by opening and closing of the second shutoff valve; calculating a volume flow rate of gas exhausted through the second shutoff valve for each filling time; and learning a relationship between the filling time and the volume flow rate; and
in the flow rate control processing,
when the target flow rate is changed from a target flow rate used in an immediately preceding process or, alternatively, when the target flow rate is changed during execution of the flow rate control processing, a correction processing of correcting the optimal filling time according to a difference between the target flow rate and a changed target flow rate based on the relationship between the filling time and the volume flow rate, that has been learnt in the learning processing, and the controller further executes:
a mode setting processing of setting a flow rate control mode of executing the flow rate control processing, a gas replacement mode of executing the replacement processing, or a learning mode of executing the learning processing, and the processing corresponding to the mode set in the mode setting processing.

6. The pulse shot-type flow rate control device according to claim 1, wherein
the controller executes:
a learning processing of: repeating the pulse shot by changing the filling time to fill the gas into the gas filling capacity by opening and closing of the first shutoff valve, while keeping a discharge time constant to discharge the gas from the gas filling capacity by opening and closing of the second shutoff valve; calculating a volume flow rate of gas exhausted through the second shutoff valve for each filling time; and learning a relationship between the filling time and the volume flow rate; and
in the flow rate control processing,
when the target flow rate is changed from a target flow rate used in an immediately preceding process or, alternatively, when the target flow rate is changed during execution of the flow rate control processing, a correction processing of correcting the optimal filling time according to a difference between the target flow rate and a changed target flow rate based on the relationship between the filling time and the volume flow rate, that has been learnt in the learning processing.

7. A pulse host-type flow rate control method, using a pulse shot-type flow rate control device comprising:
a first shutoff valve connected to a gas source;
a second shutoff valve connected to the first shutoff valve;
a gas filling capacity between the first shutoff valve and the second shutoff valve; and
a pressure sensor for measuring a pressure in the gas filling capacity,
wherein operations of the pulse shot-type flow rate control device are controlled by a controller communicatively connected to the first shutoff valve, the second shutoff valve, and the pressure sensor,
the method causes the pulse shot-type flow rate control device to perform:
two or more processes for controlling gas to a target flow rate; and
in each of the processes, a flow rate control step of:
repeating a pulse shot of causing the first shutoff valve to open and close and, after that, causing the second shutoff valve to open and close;
calculating a volume flow rate of gas exhausted from the gas filling capacity based on a pressure after filling measured by use of the pressure sensor after the first shutoff valve is opened and closed to fill gas into the gas filling capacity and a pressure after discharge measured by use of the pressure sensor after the second shutoff valve is opened and closed to discharge gas from the gas filling capacity; and
changing a manner of repeating the pulse shot to regulate the volume flow rate to the target flow rate, and the method further causes the pulse shot-type flow rate control device to perform:
an optimal filling time storage step of storing, as an optimal filling time, a filling time of filling the gas into the gas filling capacity by opening and closing of the first shutoff valve when the pulse shot that regulates the volume flow rate to the target flow rate is performed in the flow rate control step; and a filling time control step of opening and closing the first shutoff valve with the optimal filling time stored in the optimal filling time storage step in a first pulse shot in the flow rate control step in a next process to be performed after the process in which the optimal filling time storage step is performed.

8. A program installed in a controller for controlling operations of a pulse shot-type flow rate control device comprising:

a first shutoff valve connected to a gas source;
a second shutoff valve connected to the first shutoff valve;
a gas filling capacity between the first shutoff valve and the second shutoff valve; and
a pressure sensor for measuring a pressure in the gas filling capacity,
wherein when the flow rate control device performs two or more processes for controlling gas to a target flow rate,
the program causes the controller, in each of the processes, to execute a flow rate control processing of:
repeating a pulse shot of causing the first shutoff valve to open and close and, after that, causing the second shutoff valve to open and close;
calculating a volume flow rate of gas exhausted from the gas filling capacity based on a pressure after filling measured by use of the pressure sensor after the first shutoff valve is opened and closed to fill gas into the gas filling capacity and a pressure after discharge measured by use of the pressure sensor after the second shutoff valve is opened and closed to discharge gas from the gas filling capacity; and
changing a manner of repeating the pulse shot to regulate the volume flow rate to the target flow rate, and the program further causes the controller to execute:
an optimal filling time storage processing of storing, as an optimal filling time, a filling time of filling the gas into the gas filling capacity by opening and closing of the first shutoff valve when the pulse shot is performed to regulate the volume flow rate to the target flow rate in the flow rate control processing; and
a filling time control processing of opening and closing the first shutoff valve with the optimal filling time stored in the optimal filling time storage processing in a first pulse shot in the flow rate control processing in a next process to be performed after the process in which the optimal filling time storage processing is executed.

* * * * *